US006160419A

United States Patent [19]
Veenstra et al.

[11] Patent Number: 6,160,419
[45] Date of Patent: Dec. 12, 2000

[54] PROGRAMMABLE LOGIC ARCHITECTURE INCORPORATING A CONTENT ADDRESSABLE EMBEDDED ARRAY BLOCK

[75] Inventors: Kerry Veenstra, San Jose; Francis B. Heile, Santa Clara, both of Calif.

[73] Assignee: Altera Corporation, San Jose, Calif.

[21] Appl. No.: 09/167,220

[22] Filed: Oct. 6, 1998

Related U.S. Application Data

[63] Continuation-in-part of application No. 09/034,050, Mar. 3, 1998, Pat. No. 6,020,759.
[60] Provisional application No. 60/064,054, Nov. 3, 1997.
[51] Int. Cl.⁷ .............................. H01L 25/00; G06F 7/38
[52] U.S. Cl. ............................ 326/40; 326/40; 326/41; 326/39; 326/38; 326/37
[58] Field of Search ............................. 326/37, 38, 39, 326/40, 41

[56] References Cited

U.S. PATENT DOCUMENTS

| | | | |
|---|---|---|---|
| 3,849,638 | 11/1974 | Greer | 235/152 |
| 4,740,917 | 4/1988 | Denis et al. . | |
| 4,876,466 | 10/1989 | Kondou et al. | 307/465 |
| 5,099,150 | 3/1992 | Steele | 307/465 |
| 5,270,587 | 12/1993 | Zagar | 307/469 |
| 5,383,146 | 1/1995 | Threewitt | 365/49 |
| 5,408,434 | 4/1995 | Stansfield . | |
| 5,473,267 | 12/1995 | Stansfield | 326/41 |
| 5,532,957 | 7/1996 | Malhi | 365/154 |
| 5,550,782 | 8/1996 | Cliff et al. . | |
| 5,557,218 | 9/1996 | Jang | 326/40 |
| 5,559,450 | 9/1996 | Ngai et al. . | |
| 5,559,747 | 9/1996 | Kasamizugami et al. . | |
| 5,809,281 | 9/1998 | Steele et al. | 395/497.01 |
| 5,821,776 | 10/1998 | McGowam | 326/41 |
| 5,825,202 | 10/1998 | Tavana et al. | 326/39 |
| 5,838,165 | 11/1998 | Chatter | 326/38 |
| 5,838,167 | 11/1998 | Erickson et al. | 326/38 |
| 5,894,565 | 4/1999 | Furtek et al. | 395/500 |

FOREIGN PATENT DOCUMENTS 0 612 154 A1  8/1994  European Pat. Off. .

OTHER PUBLICATIONS

Stansfield, Anthony and Page, Ian. "The Design of a New FPGA Architecture", FPL, 1995.

Brown et al., "FPGA and CPLD Architectures: A Tutorial", vol. 13, No. 2, pp. 42–57, Jun. 1, 1996, IEEE Design and Test of Computers.

Reddy et al., "A High Density Embedded Array Programmable Logic Architecture", May 5–8, 1996, Proceedings of the IEEE 1996 Custom Integrated Circuits Conference, San Diego.

"Embedded Memory Enhances Programmable Logic for Complex, Compact Designs", Nov. 7, 1996, vol. 41, No. 23, EDN Electrical Design News.

Barré, "Using FPLA's: Evaluating the applications of a powerful component which can show itself to be very economical", Electronique et applications Industrielles, Apr. 1, 1978.

(List continued on next page.)

Primary Examiner—Michael Tokar
Assistant Examiner—Vibol Tan
Attorney, Agent, or Firm—Beyer Weaver & Thomas, LLP

[57] ABSTRACT

The invention relates to an integrated circuit that can be configured to operate as a content addressable memory. The integrated circuit includes a first functional block that stores at least one keyword dataword which is associated with a group of associated data words. The integrated circuit also includes a second functional block that stores the group of associated datawords. The second functional block is connected to the first functional block in such a way that if a request dataword received at the first functional block matches at least one keyword dataword stored therein, then an associated result dataword included in the group of associated data words stored in the second functional block is output by the second functional block. Typically, the integrated circuit chip is a complex programmable logic device architecture (CPLD).

27 Claims, 9 Drawing Sheets

OTHER PUBLICATIONS

Kaviani et al., "Hybrid FPGA Architecture", Proceedings 4$^{th}$ International Symposium on FPGA's (FPGA 96), Feb. 1996.

Press release, "Altera Enables System–Level Integration With Rafael Family of Embedded PLDs", Aug. 31, 1998, hht;://www.altera.com/html/new/pressrel/pr_rafael2.html.

Press release, "Altera Unveils New Name for Rafael: Advanced Programmable Embedded Matrix (APEX)", Aug. 31, 1998, http://www.altera.com/html/new/pressrel/pr_apex1.html.

Datasheet, "Apex 20K Device Family: Breakthrough MultiCore Architecture", http://www.alters.com/html/products/apex2.html.

Datasheet, "Apex 20K Device Family: The Embedded PLD Family for System–Level Integration", http://www.altera.com/html/products/apex.html.

Bursky, Dave, "Combination RAM/PLD Opens New Application Options", Electronic Design, pp. 138–140, May 23, 1991.

Intel Corporation "10 ns FLEXlogic FPGA With SRAM Option", INTEL® iFX780, pp. 2–24–2–46, Nov. 1993.

NGAI, Tony Kai–Kit, "An SRAM–Programmable Field–Reconfigurable Memory", Department of Electrical Engineering, Universersity of Toronto, Thesis for Master of Applied Science, 1994.

Altera corporation "APEX 20k Programmable Logic Device Family", ALTERA® Oct. 1998, ver. 1.

PROGRAMMABLE LOGIC ARCHITECTURE INCORPORATING A CONTENT ADDRESSABLE EMBEDDED ARRAY BLOCK

CROSS REFERENCE TO RELATED APPLICATION

This application is a continuation-in-part of U.S. application Ser. No. 09/034,050 filed Mar. 3, 1998 now U.S. Pat. No. 6,020,759 and entitled "PROGRAMMABLE LOGIC ARRAY DEVICE WITH RANDOM ACCESS MEMORY CONFIGURABLE AS PRODUCT TERMS" which is hereby incorporated by reference. This application also claims benefit of priority under 35 U.S.C. §119(e) of U.S. Provisional Application No. 60/064,054, filed Nov. 3, 1997, and entitled "PROGRAMMABLE LOGIC ARCHITECTURE INCORPORATING A CONTENT ADDRESSABLE EMBEDDED ARRAY BLOCK" which is hereby incorporated by reference.

BACKGROUND OF THE INVENTION

1. Field of the Invention

This invention relates generally to a programmable logic device, and to a programmable logic device operable as a content addressable memory (CAM).

2. Description of the Related Art

A programmable logic device (PLD) is a programmable integrated circuit that allows the user of the circuit, using software control, to customize the logic functions the circuit will perform. The logic functions previously performed by small, medium, and large scale integration integrated circuits can instead be performed by programmable logic devices. When a typical programmable logic device is supplied by an integrated circuit manufacturer, it is not yet capable of performing any specific function. The user, in conjunction with software supplied by the manufacturer or created by the user or an affiliated source, can program the PLD to perform the specific function or functions required by the user's application. The PLD can then function in a larger system designed by the user just as though dedicated logic chips were employed. For the purpose of this description, it is to be understood that a programmable logic device refers to once programmable as well as reprogrammable devices.

Programmable logic encompasses all digital logic circuits that are configured by the end user, including PLDs, field programmable gate arrays (FPGAs) and complex programmable logic devices (CPLDs). These different programmable logic devices can have substantially different architectures. Once common architecture for PLDs or CPLDs is known as an embedded array programmable logic design.

The general architecture of an embedded array programmable logic design will be generally familiar to those knowledgeable of the FLEX10K™ logic family of devices manufactured by the Altera Corporation of San Jose, Calif. Such an architecture, for example, is described in U.S. Pat. No. 5,550,782 and Altera Data Book 1996, both of which are incorporated herein by reference.

Referring initially to FIG. 1, a CPLD 100 with an embedded array programmable logic design will be described. Although only a few logic array blocks or memory blocks are illustrated, it should be appreciated that any number may be provided in order to meet the needs of a particular system.

The CPLD 100 includes a plurality of logic array blocks (LAB) 110 and a plurality of embedded array blocks (EAB) 112. Each EAB 112 includes a memory array 111. Each LAB 110 includes a plurality of logic elements LE 113 which are each capable of performing simple logic functions.

As shown in FIG. 1, the plurality of LABs 110 and the plurality of EABs 112 are programmably interconnected by way of a plurality global horizontal conductors 114 and a plurality of global vertical conductors 116 to form a logic and memory array. The global horizontal conductors 114 couple to the horizontal ports 108, and the global vertical conductors 116 couple to the vertical ports 106.

The EAB is a flexible block of random access memory (RAM) with registers on the input and output ports. As is known in the art, a RAM is an array of individual memory cells, of which each cell includes a plurality of transistors configured to store digital data in the form of a single bit. Typically, the individual memory cells are arranged to form data words of varying length depending upon the particular application. In practice, data words may be of any length, however, data word lengths of 1, 8, 16, or 32 bits are common but any word length desired by the user is possible. As structured, the RAM device has the ability to access, or read, each stored data bit or data word independently of any other stored data bit or word by selectively enabling desired rows and columns.

Many applications such as database machines, image or voice recognition devices, or computer and communication networks require high speed searches of databases, lists, or patterns. Commonly, high speed searches using RAM employ search algorithms such as binary, tree-based searches, or look aside tag buffers. Unfortunately, the structure of the RAM requires these algorithms to sequentially compare the desired information against the pre-stored data within the RAM in a manner that is relatively slow, thereby leading to unacceptable search times.

To address the need for high speed searches in large databases, lists or patterns, a device known in the art as the content addressable memory (CAM) was developed. The CAM is a memory device that accelerates the applications such as database machines, image or voice recognition devices, or computer and communications networks that require fast searches of a database, list, or pattern. CAMs may have significant performance advantages over use of RAM in performing high speed searches since CAMs compare the entire list of pre-stored data simultaneously. Typically, in performing high speed searches, the CAM based search engine delivers up to an order of magnitude faster performance than a RAM based search engine.

In view of the foregoing, it would be advantageous and therefore desirable to provide a programmable logic device operable as an efficient configurable content addressable memory.

SUMMARY OF THE INVENTION

Broadly speaking, the invention relates to an integrated circuit that can be configured to operate as a content addressable memory. Typically, the integrated circuit chip is a complex programmable logic device architecture (CPLD). The complex programmable logic device can be a part of a larger system such as for example, a reconfigurable computer just as easily as a stand alone chip. By using the reprogrammable nature of the complex programmable logic device, the invention is able to be configured as needed to operate as a content addressable memory. The ability to be configured as needed to operate as a content addressable memory greatly increases the number of high speed data retrieval and communication applications to which the complex programmable logic device can be used.

In one embodiment of the invention, an integrated circuit operable as a content addressable memory device includes a first multi-function functional block having a plurality of operation modes. A first of the operation modes enables the first multi-function functional block to receive a request dataword on input lines, to compare the request dataword with a plurality of keyword datawords previously stored in a first programmable memory storage array of the first multi-function functional block in the first operation mode, and to output on output lines a select signal when the comparing indicates that the request dataword matches an identified keyword dataword of the keyword datawords. The keyword datawords are associated with a group of associated datawords. The integrated circuit also includes a second multi-function functional block having a plurality of operation modes. A first of the operation modes enables the second multi-function functional block to receive the select signal on input lines from the first multi-function functional block, to then select an associated dataword from the group of associated datawords previously stored in a second programmable memory storage array of the second multi-function functional block in the first operation mode, and then to output the selected associated dataword on output lines. The selected associated dataword being associated with the identified keyword dataword.

In another embodiment of the invention, an integrated circuit operable as a content addressable memory device is disclosed. The inventive integrated circuit includes a plurality of interconnection lines and a first functional block having a first functional block input line and a first functional block output line that programmably connect to the plurality of interconnection lines. The first functional block stores at least one keyword dataword associated with a group of associated datawords and receives a request dataword at the first functional block input line. The first functional block generates a select signal at the first functional block output lines based upon a comparing of the received request dataword and the stored keyword dataword. The integrated circuit also includes a second functional block having a second functional block input line programmably connected to the first functional block output line by way of the plurality of interconnection lines and a second functional block output line. The second functional block can store the group of associated datawords and receive the select signal at the second functional block input lines. The second functional block outputs to the second functional block output lines an output signal based on the received select signal.

In another embodiment of the invention, a method of using an integrated circuit operable as a content addressable memory is disclosed. The integrated circuit has a first functional block coupled to a second functional block and the first functional block and the second functional block can store datawords. The inventive method includes the following operations. First, a first dataword having a first plurality of data bits is received at the first functional block. Next, it is determined whether the received first dataword matches any one or more of second datawords stored in the first functional block, the second datawords each include a second plurality of data bits. Next, an appropriate select signal is sent from the first functional block to the second functional block based upon the determining of whether the received first dataword matches any one or more of the second datawords stored in the first functional block. Next, an appropriate output signal is sent from the second functional block, the appropriate output signal based upon the appropriate select signal received from the first functional block.

In yet another embodiment of the invention, a programmable logic device is disclosed. The programmable logic device includes a multi-function logic device capable of operating in a plurality of logic modes in accordance with programming signals. The programmable logic device also includes a multi-function memory device capable of operating in a plurality of memory modes in accordance with programming signals. In a preferred embodiment of the invention, one of the memory modes is a content addressable memory mode.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

The invention relates to an integrated circuit that can be configured to operate as a content addressable memory (CAM). The CAM results from at least a pair of suitably coupled and programmed functional blocks.

Typically, the integrated circuit chip is a complex programmable logic device (CPLD) having various functional blocks included therein. The CPLD can be a part of a system such as for example, a reconfigurable computer, or the CPLD can be used as a stand alone chip. Any pair of the functional blocks of the CPLD can be suitably coupled and programmed to operate as a CAM. By taking advantage of the reprogrammable nature of the CPLD, the invention is capable of providing a configurable CAM in real time. This capability to re-configure in real time as a CAM substantially increases the number of high speed data retrieval and communication applications to which the CPLD can be used.

In the following description, numerous specific details are set forth in order to provide a thorough understanding of the present invention. It will be apparent, however, to one skilled in the art that the present invention may be practiced without some or all of these specific details. In other instances, well known structures or operations have not been described in detail in order to not unnecessarily obscure the invention.

Although the invention pertains to an integrated circuit configured as a content addressable memory device, the invention is discussed below in the context where the integrated circuit is a CPLD. Generally speaking, a CPLD includes function blocks, programmable routing resources, and input/output points.

Figure 1:
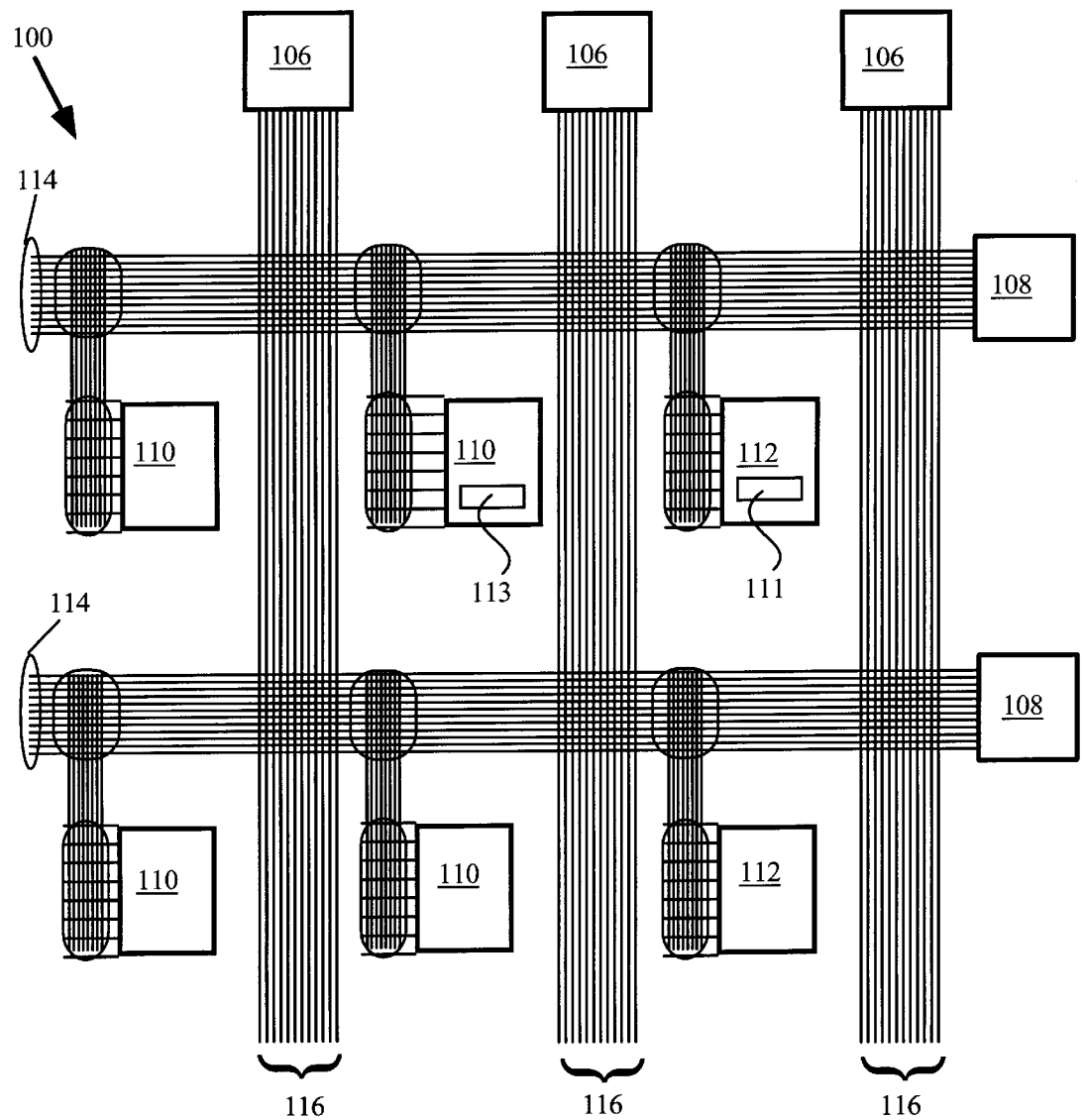
FIG. 1 is an illustration of a conventional embedded array programmable logic device.
Figure 2:
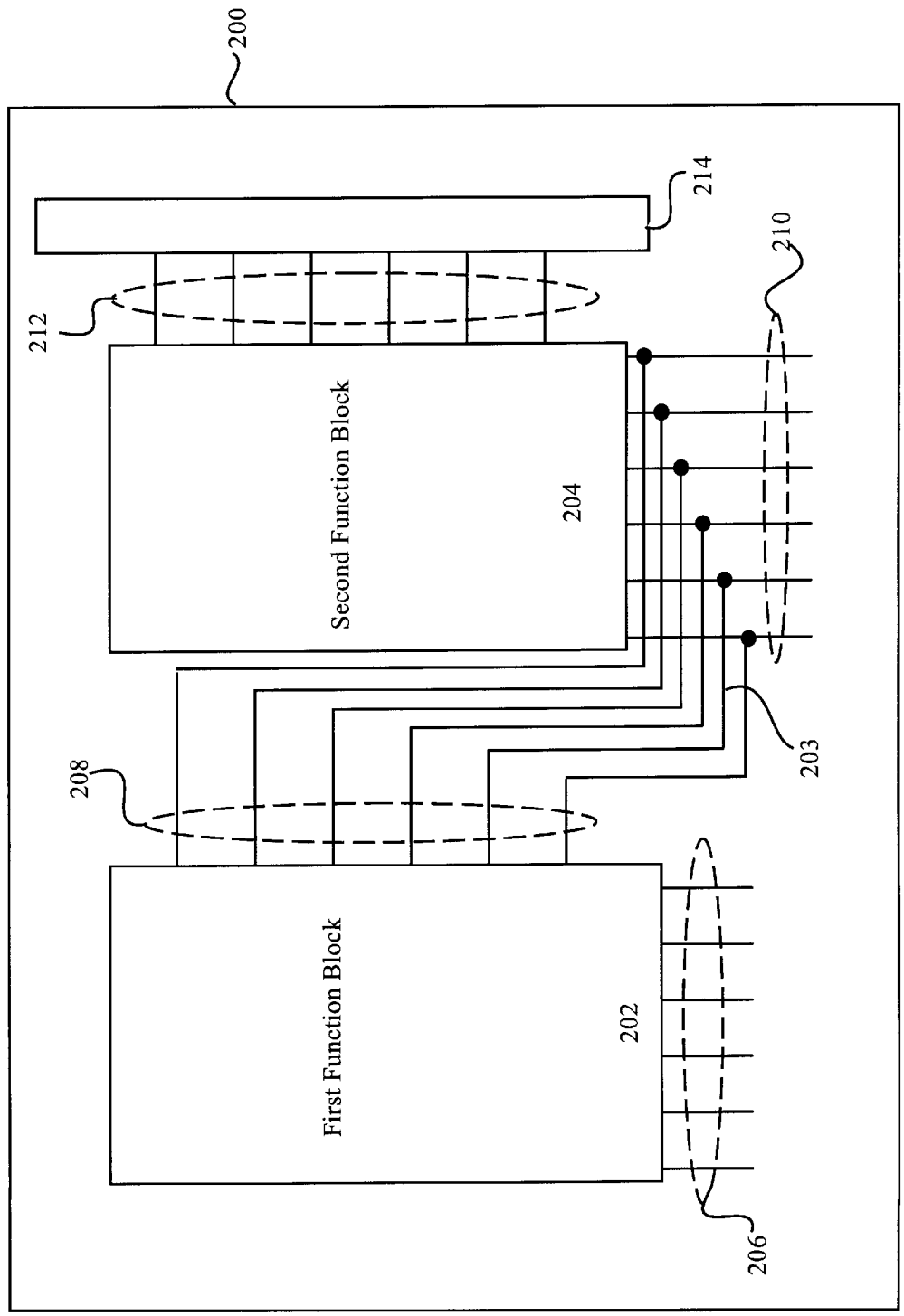
FIG. 2 is a block diagram of a representative section of a complex programmable logic device operable as a content addressable memory in accordance with a basic embodiment of the invention.

FIG. 2 is a block diagram of a representative section 200 included in a CPLD and operable as a CAM in accordance with a basic embodiment of the invention. The representative section 200 includes a first functional block 202 and a second functional block 204. The first functional block 202 has a group of input lines 206 and a group of output lines 208.

The output lines 208 can be programmably coupled to the second functional block 204 at input lines 210 via selected ones of a group of interconnection lines 203. The second functional block 204 has a output lines 212. In one embodiment, the output lines 212 can be programmably connected to other functional blocks included in the CPLD. In another embodiment, the output lines 212 can be programmably connected to external circuitry by way of bi-directional I/O ports included in the CPLD.

It should be noted that the group of interconnection lines 203 serve to interconnect the functional blocks 202 and 204 included in the representative section 200. Often, in a CPLD, these interconnection lines 203 would be provided by a programmable path using the routing resources of the CPLD.

In one embodiment, the first functional block 202 includes a memory array that can store at least one keyword dataword A. The keyword dataword A can be formed of n binary bits. The keyword dataword A, in turn, can be associated with at least one result word dataword R that can be formed of m binary bits. In the described embodiment, the at least one result word dataword R can be stored in a memory array included in the second functional block 204. It should be noted that the keyword dataword A and the result word dataword R can be of different sizes (i.e., n≠m) or the same size (i.e., n=m). The keyword data word A and the result word dataword R form an associated pair represented by the term (A, R). More generally, for any keyword $A^i$ there can be associated any result word $R^j$ (where i and j are integers), and vice versa. For example, the keyword $A^i$ can be a single keyword $A^1$ any number of keywords $A^1 \cdots i$ as deemed suitable by the application at hand. Likewise, the associated result word dataword $R^j$ can be a single result word dataword $R^1$ or any number of result words $R^{1 \cdots j}$. In this manner, the representative section 200 can be used to associatively couple any number of keyword datawords $A^i$ included in the first functional block 202 and any number of result word datawords $R^j$ included in the second functional block 204 as deemed suitable for a particular application.

In one embodiment, the first functional block 202 can be configured to act as a programmable address decoder. So configured, the first functional block 202 can form an address select word S on the output lines 208. More particularly, when a request word dataword B received at the group of input lines 206 matches at least one of the keyword datawords $A^i$ stored in the first functional block 202, then the appropriate address select word (s) is output on the output lines 208. The address select word S can be used to define the location (or locations) in the second functional block 204 where the result word dataword (or datawords) $R^j$ associated with the keyword (or keywords) $A^i$ are stored. In one embodiment, a "match" means that the received request word dataword B is identically the same as at least one of the keyword datawords $A^i$ stored in the first functional block 202. In another embodiment, the request word dataword B need only match a specified portion of the keyword dataword $A^i$ stored in the first functional block 202. Such a situation can be illustrated by the use of a "wildcard" character to select any datawords having specified data bits in common. For example, in the situation where "{1} {0}*" ("*" is the wildcard character) is the request word dataword B, all keywords $A^i$ having "{1} {0}" as the first two data bits are considered matching.

The address select word S is forwarded to the second functional block 204 by way of the output lines 208. The second functional block 204 uses the address select word S to decode the location in the memory array within the second functional block 204 where the result word dataword $R^j$ associated with the keyword $A^i$ is stored. Once the stored result word dataword $R^j$ is selected, it can be output to a data buffer unit 214 connected to the group of second functional block output lines 212. Accordingly, in response to the request word dataword B the representative section 200 operates to output the result word dataword R. As such, the representative section operates as a CAM. In one embodiment, a MATCH signal indicative of the request word dataword B matching in a specified manner at least one of the keyword datawords $A^i$ in the first functional block 202 can be output in addition to the result word dataword $R^j$. In another embodiment, the application may only require the output of the MATCH signal. Alternatively, a NO-MATCH signal can be generated by the second functional block 204 when the received request word dataword B does not match any of the keywords $A^i$ stored in the first functional block 202. In such a case, the second functional block 204 can be programmably configured to supply the NO-MATCH signal to the data buffer 212 via the group of second functional block output lines 214.

Although not required, in the case of a CPLD, the functional block 202 and the functional block 204 can often be configured in many operational modes as deemed suited for a desired application. By way of example, the functional blocks 202 and 204 can each be a logic array block (LAB) or an embedded array block. (EAB) which are operable in more than one mode. In the detailed embodiment discussed below, functional blocks 202 and 204 are assumed to be embedded array blocks (EABs) that have a memory array capable of storing the at least one keyword dataword $A^i$ and the associated result word dataword $R^j$, respectively. In a preferred embodiment, the functional blocks 202 and 204 are embedded array blocks (EABs) operable in what is referred to as a product term mode, or more typically as, a P-term mode. One such embedded array block (EAB) operable in the P-term mode is described in Heile's U.S. Application No. 09/034,050 filed Mar. 3, 1998 which is hereby incorporated by reference herein in its entirety.

By way of example, the first functional block 202 can be configured to operate as an EAB in the P-term mode since the EAB includes circuitry which can be operated either as random access memory ("RAM") or to perform product term ("P-term") logic. In the RAM mode, each individual row of the memory array is separately addressable for writing data to the memory array or reading data from the memory array. Alternatively, in P-term mode, multiple rows of the memory array are addressable in parallel to read product terms from the memory array. The capability of the memory circuitry to perform product term logic provides an efficient way to perform wide fan-in logic functions which would otherwise require multiple combinatorial logic trees.

Figure 3:
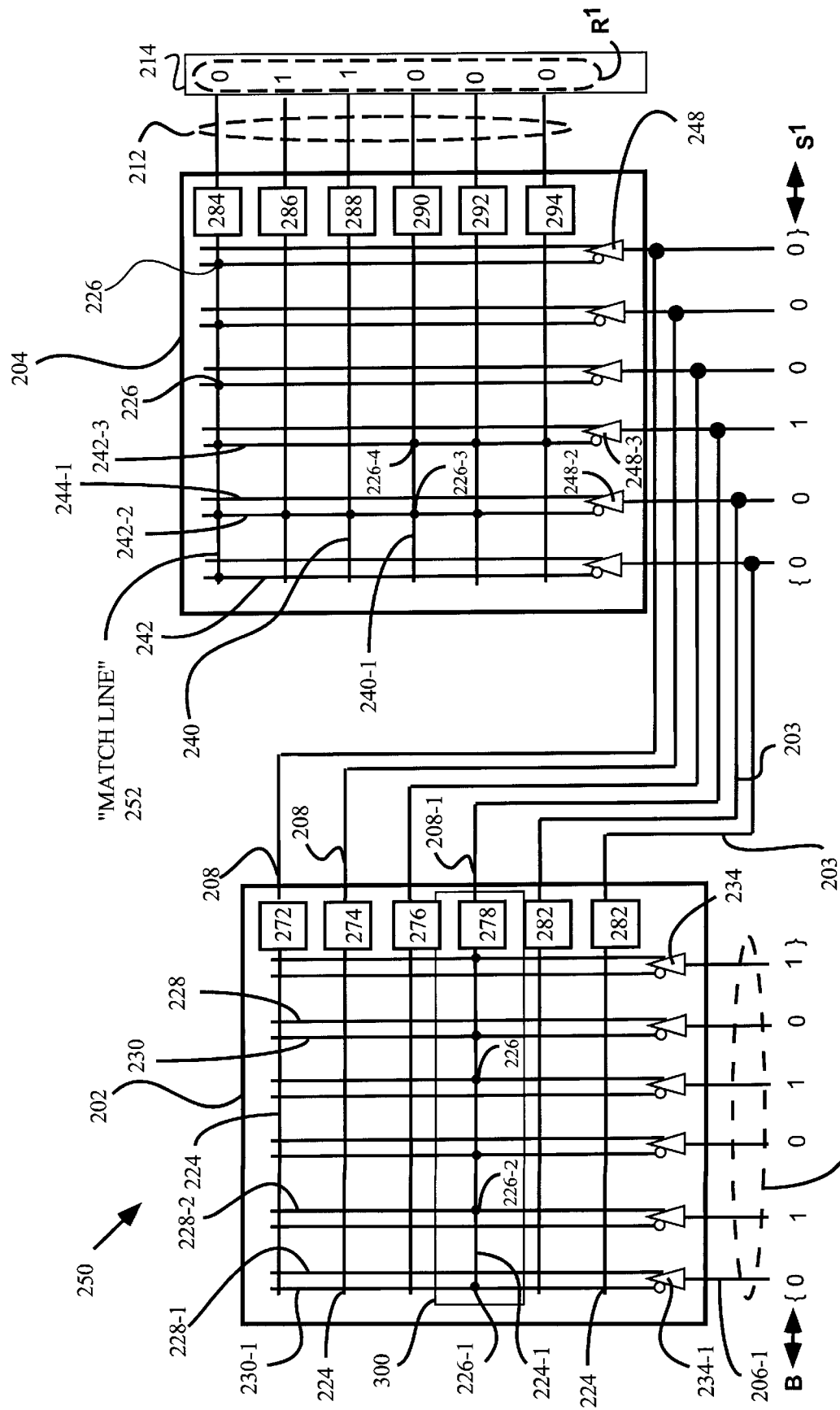
FIG. 3 is a schematic representation a representative section of a complex programmable logic device operable as a content addressable memory in accordance with a basic embodiment of the invention.

FIG. 3 is a schematic diagram of a representative section 250 configured to operate as a content addressable memory in accordance with an embodiment of the invention. The representative section 250 is generally structured as was the representative section 200, except that the first functional unit 202 and the second functional units 204 are implemented as EABs. As shown, the EAB 202 and the EAB 204 can be configured to operate in the P-term mode, as described above.

The EAB 202 has output driver units 272–282 connected to the output lines 208. The output driver units 272–282 each have an associated input line 224. the input lines 240 can be programmably connected to appropriate ones of true data lines 228 and complementary data line 230 by way of programmable connectors 226. As an example, the input line 224-1 associated with the output driver unit 278 can be programmably connected to the complementary data line 230-1 by way of the programmable connector 226-1 and the true data line 228-2 by way of the programmable connector 226-2.

The true data lines 228 and the complementary data lines 230 are connected to input drivers 234. The input drivers 234 can receive the request word dataword B from the group of input lines 206. The input drivers 234 can then operate too respectfully supply a true dataword signal and a complementary dataword signal to the true data output lines 228 and the complementary data output lines 230. It should be noted that by true dataword it is meant the input drivers 234 do not act to change the polarity of the received dataword. Alternatively, by complementary dataword, it is meant the input drivers 234 do act to switch the polarity of the received dataword to its complementary value. By way of example, when a received request word dataword B, for instance, is formed of the binary bits [{0} {1} {0} {1} {0} {1}], the associated true dataword BT is formed of the associated true binary bits [{0} {1} {0} {1} {0} {1}], whereas the complementary dataword $B^I$ is formed of the associated complementary binary bits [{1} {0} {1} {0} {1} {0}].

Continuing the example from above, when the request word dataword B is received at the group of input lines 206, a first data bit {0} of the request word dataword B is supplied to the input driver 234-1 via the input line 206-1. The input driver 234-1 then acts to supply a true first data bit signal {0} and a complementary first data bit signal {1} to the true data line 228-1 and the complementary data line 230-1, respectively. Since the complementary data line 230-1 is programmably connected to the input line 224-1 by way of the programmable connector 226-1, the, complementary first data bit signal {1} can form a first input signal {1} to the output driver unit 278.

The EAB 204 has output driver units 284–294 connected to the output data buffer 214 by way of the output lines 212. The output driver units 284–294 each have an associated input line 240. The input lines 240 can be programmably connected to appropriate ones of true data lines 244 and complementary data lines 242 by way of programmable connectors 226. The true data lines 244 and the complementary data lines 242 can, in turn, be connected to input drivers 248. As an example, the output driver unit 290 connected to the input line 240-1 can be programmably connected to the complementary data line 242-2 by way of the programmable connector 226-3 and the complementary data line 242-3 by way of the programmable connector 242-3. The complementary data line 242-2 is, in turn, connected to the input driver 248-2, and the complementary data line 242-2 is, in turn, connected to the input driver 248-3. In this manner, by programmably connecting selected ones of the true data lines 244 and selected ones of the complementary data lines 242 to the input lines 240, a select signal (such as the address select word S) received by the input drivers 248 can be used to cause selected ones of the output drivers 284–294 to form a desired output signal (such as the result word dataword $R^I$).

Figure 4:
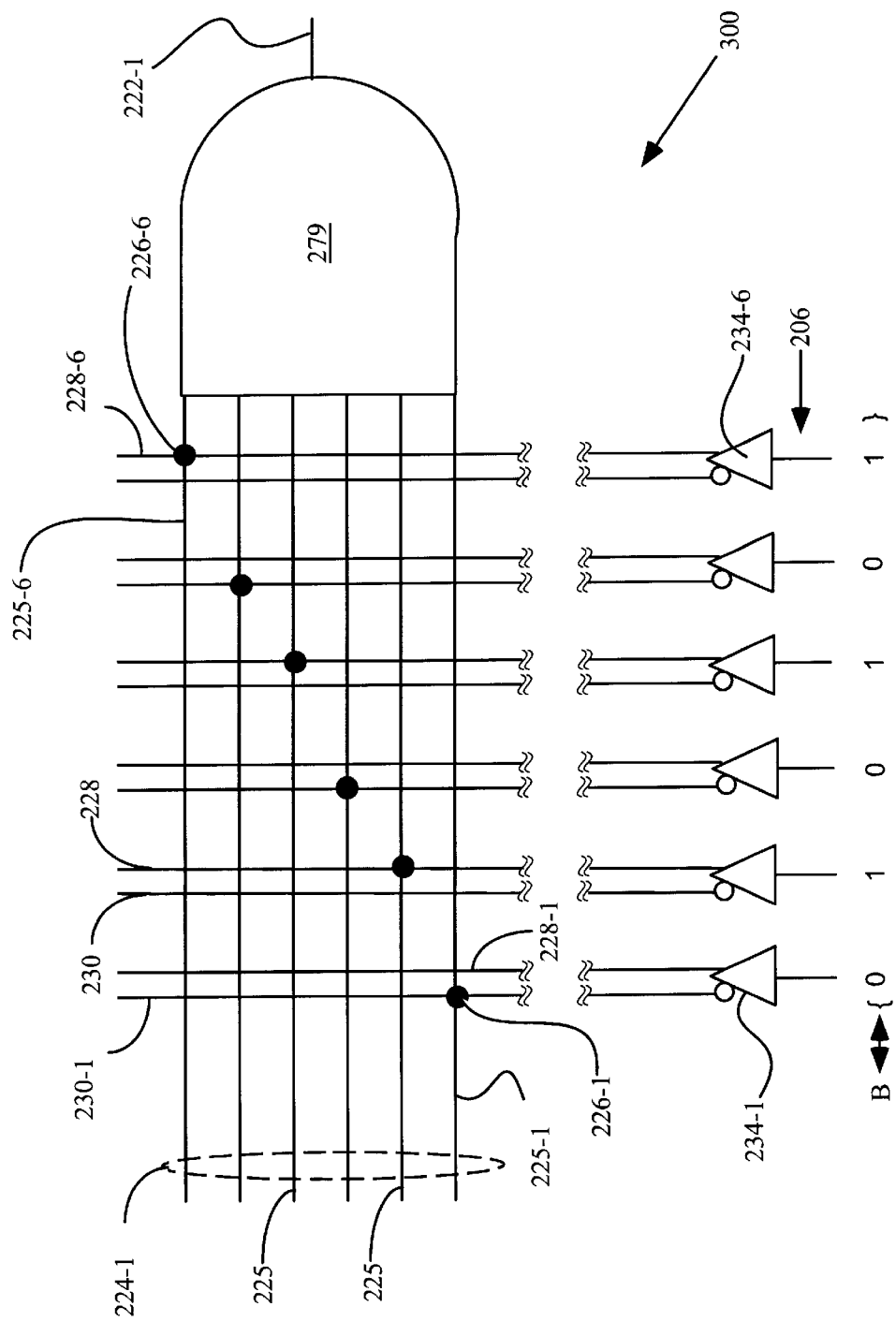
FIG. 4 is a circuit diagram of a representative section of an AND gate circuit configured to operate in a P-term mode in accordance with a preferred embodiment of the invention.

FIG. 4 is a circuit diagram of a portion 300 of the EAB 202 illustrated in FIG. 3 configured to operate in a P-term mode in accordance with one embodiment of the invention. The input line 224-1 is formed of a group of wordlines 225 which form a product term input, or P-term input, to an AND circuit 279 included in the output driver unit 278. The wordlines 225 are, in turn, programmably connected to selected ones of the true data line 228 and the complementary data line 230 so as to programmably store a desired dataword, such as the at least one keyword $A^i$, in the memory array within the EAB 202. By way of example, a keyword $A^1$ represented by the binary string [{0} {1} {0} {1} {0} {1}] can be programmed into the memory array within the EAB 202 by programmably connecting the wordlines 225 included in the input line 224-1 to appropriate ones of the true data lines 228 and the complementary data lines 230. For example, the first data bit {0} of the keyword dataword $A^1$ can be stored in the memory array by connecting the wordline 225-1 to the complementary data line 230-1 using the programmable connector 226-1. Likewise, the sixth data bit {1} of the keyword dataword $A^1$ can be stored in the memory array by connecting the wordline 225-6 to the true data line 228-6 using the programmable connector 226-6. All others of the data bits of the keyword dataword $A^1$ can be stored in the memory array in a similar manner.

When a request word dataword, such as the request dataword B formed of the binary string [{0} {1} {0} {1} {0} {1}], is received at the group of input lines 206, each of the inverters 234 substantially simultaneously receives an associated data bit of the request dataword B, and, as discussed above, supplies true and a complementary data bit signals to the true data lines 228 and the complementary datalines 230, respectively. Continuing the example, the inverter 234-1 receives the first data bit {0} of the request dataword B. The inverter 234-1 then supplies a true first data bit signal{0} and a complementary first data bit signal {1} to the true data line 228-1 and the complementary data line 228-1. Since, in this example, only the complementary dataline 230-1 is connected to the wordline 225-1 by programmable connector 226-1, only the complementary first databit signal {1} equivalent to a "logical 1" is supplied to the wordline 225-1. To further illustrate, the inverter 234-6 receives the last databit {1} of the request dataword B which in turn supplies a true last databit signal {1} to the wordline 225-6 by way of the true dataline 228-6 via the programmable connector 226-6. The remaining data bits of the request dataword B are substantially simultaneously received by the inverters 234 and subsequently processed in the same manner.

When, as in the current example, the request dataword B is identically the same as the stored keyword $A^1$, all the wordlines 225 included in the input line 224-1 which form inputs to the logical AND circuit 279 are supplied with ""logical 1"" equivalents. As is known in the art, the logical AND circuit 279 generates a ""logical 1"" output signal only when all inputs to the logical AND circuit 279 (i.e., wordlines 225) are driven to a "logical 1" value, or its equivalent. Thus, when the request dataword B identically matches the stored keyword $A^1$ stored on the input line 224 by the programmable connectors 226 the associated output driver unit 278 supplies a "logical 1" signal to the output line 208-1. In this manner, the address selection signal S is formed.

It should be noted that when the request dataword B does not match any of the keywords $A^i$ stored in the EAB 202, the address signal S can be formed of all logical 0's, which can be used by the EAB 204 to generate a NO-MATCH signal. In such a case, normally no meaningful result word dataword $R^i$ is output; instead, a predetermined code can be output indicating a NO-MATCH condition.

Referring again to FIG. 3, since only the input line 224-1 is programmed with the keyword $A^1$ which matches the received request word dataword B, the only output line 208 to be driven to a "logical 1" value is the output line 208-1. In this case, the associated address select signal $S^1$ includes the data bits [{0} {0} {1} {0} {0} {0}] indicative of the matched keyword $A^1$ in the EAB 202 (also referred to as the "Address Selector EAB"). The address select signal $S^1$ can be used by the EAB 204 (also referred to as the "Decoder Selector EAB") to determine the location of the associated result word dataword $R^1$ in memory array. In the described embodiment, the result word dataword $R^1$ retrieved from the memory array and stored in the output data buffer 214 includes the data bits [{0} {1} {1} {0} {0}{0}].

As can be seen, the result word dataword $R^1$ can be formed by connecting the complementary dataline 242-2 and 242-3 to appropriate ones of the input lines 240 such that the address selector signal $S^1$ is capable of causing only the output drivers 286 and 288 each to supply a "logical 1" signal, or its equivalent, to the output data buffer 214.

It should be noted, when the address select signal S [{0} {0} {0} {0} {0} {0}] corresponding to the NO-MATCH case is supplied to the EAB 204, the NO-MATCH line 252 and all wordlines included therein are driven to "logical 1" value, or its equivalent. This results in the EAB 204 supplying an associated NO-MATCH signal [{1} {0} {0} {0} {0} {0}] to the output data buffer unit 214 from the output driver units 284–294, respectfully.

Figure 5:
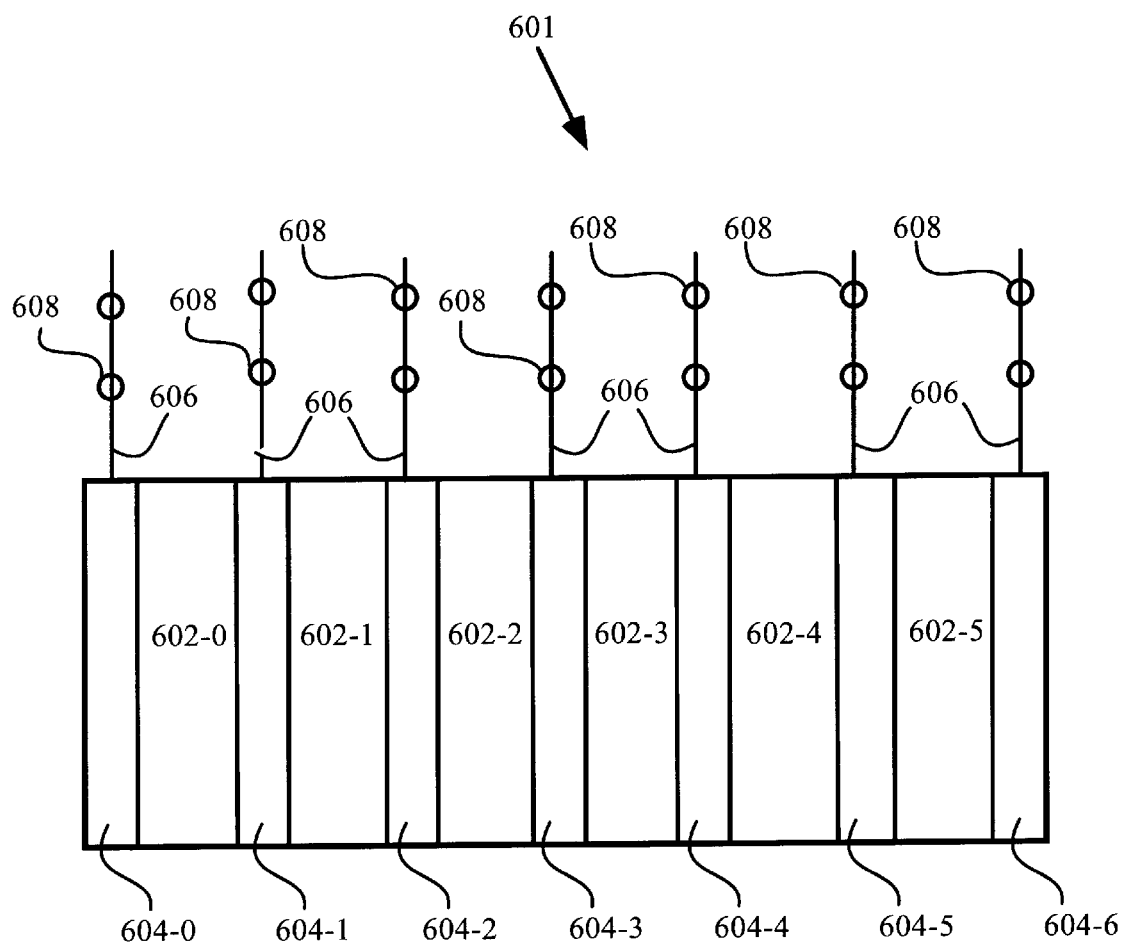
FIG. 5 is a block diagram of a multi-function functional block operable as a content addressable memory in accordance with another embodiment of the invention.

FIG. 5 is a block diagram of a multi-function functional block 601 operable as a content addressable memory in accordance with another embodiment of the invention. The multi-function functional block 601 includes a group of function units 602 (602-0 through 602-5) interconnected by way of programmable interconnect arrays 604 (604-0 through 604-6). Each of the programmable interconnect arrays 604 receives a group of programmable interconnect array I/O lines 606. Each of the programmable interconnect array I/O lines 606 has an associated group of programmable connectors 608 that are programmed by programming resources and operate to selectively connect the interconnect array I/O lines 606 (and thus the function units 602) to other conductor lines and/or multi-function functional blocks, for example, included in a CPLD. It should be noted that only a few of the programmable connectors 608 are shown for sake of clarity since there can be any suitable number of the programmable connectors 608 included in the CPLD.

Although not required, the multi-function functional block 601 is often included in an integrated circuit such as a CPLD, and each of the function units 602 included in the multi-function functional block 601 can be configured in many operational modes as deemed suited for a desired application. By way of example, the function units 602-3 and 602-4 can both be an embedded array block (EAB) operable in P-term mode.

When the multi-function functional block 601 operates as a content addressable memory device, one possible configuration has the PIA 604-3 providing input lines capable of receiving a request dataword to the EAB 602-3. The EAB 602-3 then operates to P-term match the received request dataword with a keyword dataword previously stored in the EAB 602-3. The EAB 602-3, in turn, generates an appropriate select signal at signal lines provided by the PIA 604-4 which, in turn, programmably forms inputs to the EAB 602-4. The EAB 602-4 then uses the received select signal to generate an appropriate output signal at output lines provided by the PIA 604-5.

Figure 6:
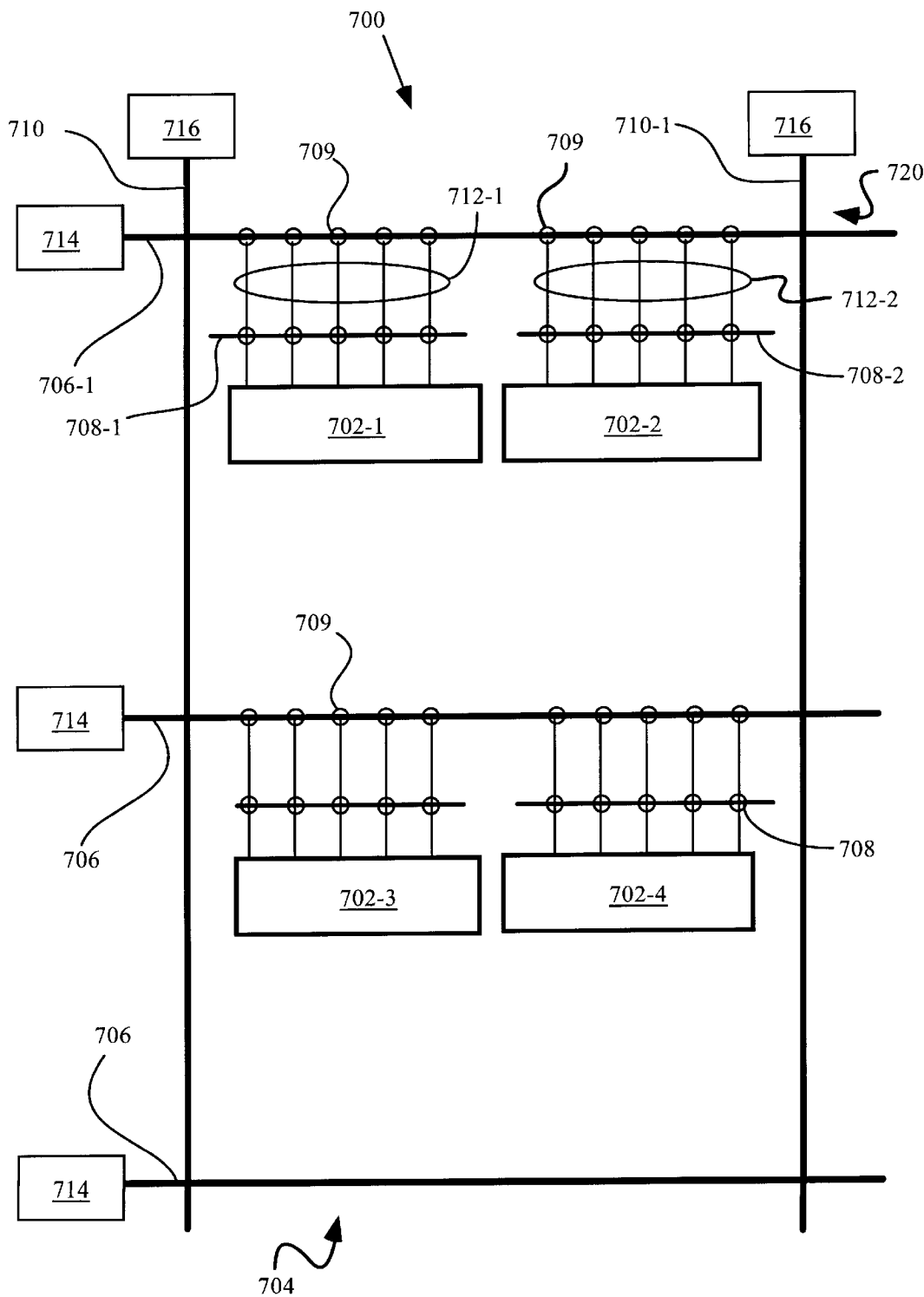
FIG. 6 is a schematic representation of a complex programmable logic device incorporating at least one of the multi-function functional blocks illustrated in FIG. 5.

FIG. 6 is a block diagram of a CPLD 700 that includes a plurality of the multi-function functional blocks 702 each capable of operation as a content addressable memory device. Although only a few of the multi-function functional blocks 702 are illustrated in FIG. 6, it should be appreciated that any number may be provided in order to meet the needs of a particular system.

As shown in FIG. 6, the CPLD 700 includes a plurality of multi-function functional blocks 702(702-1 through 702-4) included in a core region 704. Each of the multi-function functional blocks 702 are, respectively, programmably connected to a global horizontal conductor 706, a local horizontal conductor 708 and a global vertical conductor 710 by way of programmable connectors 709 to implement logical circuits within the CPLD 700. In one embodiment, the multi-function functional block 702-1 is connected to a global horizontal conductor 706-1 and a local horizontal conductor 708-1 by way of the programmable interconnect array I/O lines 712-1. In a similar fashion, a multi-function functional block 702-2 is connected to the global horizontal conductor 706-1 and a local horizontal conductor 708-2 by way of the programmable interconnect array I/O lines 712-2. In this way, the multi-function functional blocks 702-1 and 702-2 can communicate with any other of the multi-function functional blocks 702 included in the CPLD 700. The multi-function functional blocks 702-1 and 702-2 can also communicate with any external circuitry by way of the horizontal bi-directional ports 714 or the vertical bi-directional ports 716 included in a peripheral region 720.

Figure 7:
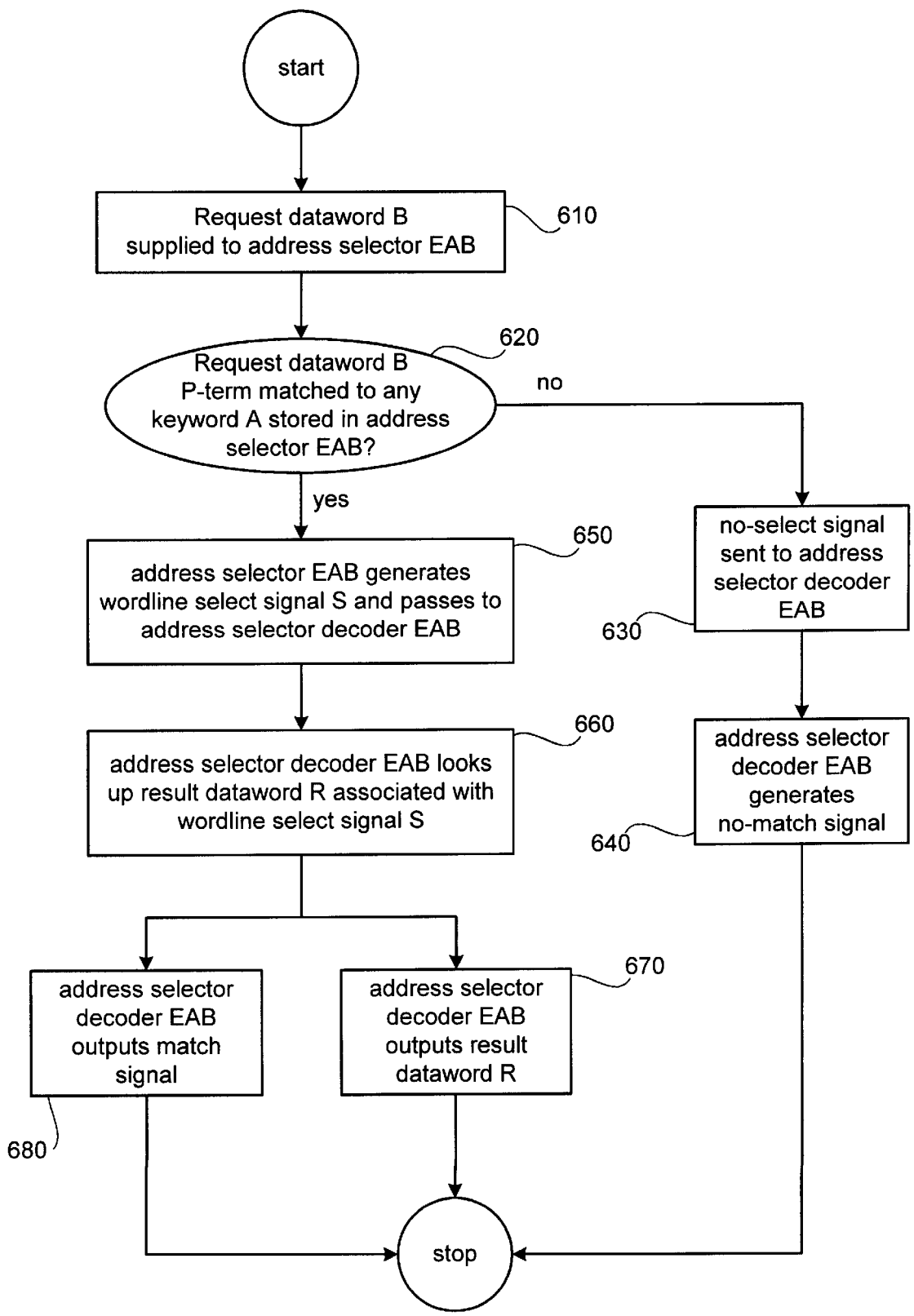
FIG. 7 is a flowchart detailing a content addressable memory device READ operation in accordance with an embodiment of the invention.

FIG. 7 is a flowchart detailing a content addressable memory device READ operation in accordance with an embodiment of the invention. The READ operation includes the following operations. First, a request dataword B is supplied 610 to the address selector EAB. The request dataword B can be supplied by any circuitry connected to the address selector EAB included in the CPLD or the circuitry can be external to the CPLD. Next, the request word dataword B is P-term matched 620 to any keyword $A^i$ stored in the address selector EAB. Next, the address selector EAB generates 630 a wordline select signal S and passes it to an address select decoder EAB when the request word dataword B P-term matches any of the keywords $A^i$ stored in the address selector EAB. When the select signal S is received at the address selector decoder EAB, the address selector decoder EAB operates to look up 660 the result word dataword $R^j$ associated with the wordline select signal S. The address selector decoder EAB then outputs 670 the result word dataword R$^j$. The address selector decoder EAB substantially simultaneously outputs 680 an associated MATCH signal.

If, however, the request word dataword B does not P-term match any of the keywords A$^i$ stored in the address selector EAB, then a NO-SELECT signal is sent 630 to the address selector decoder EAB. The address selector decoder EAB then generates 640 a NO-MATCH signal.

Figure 8:
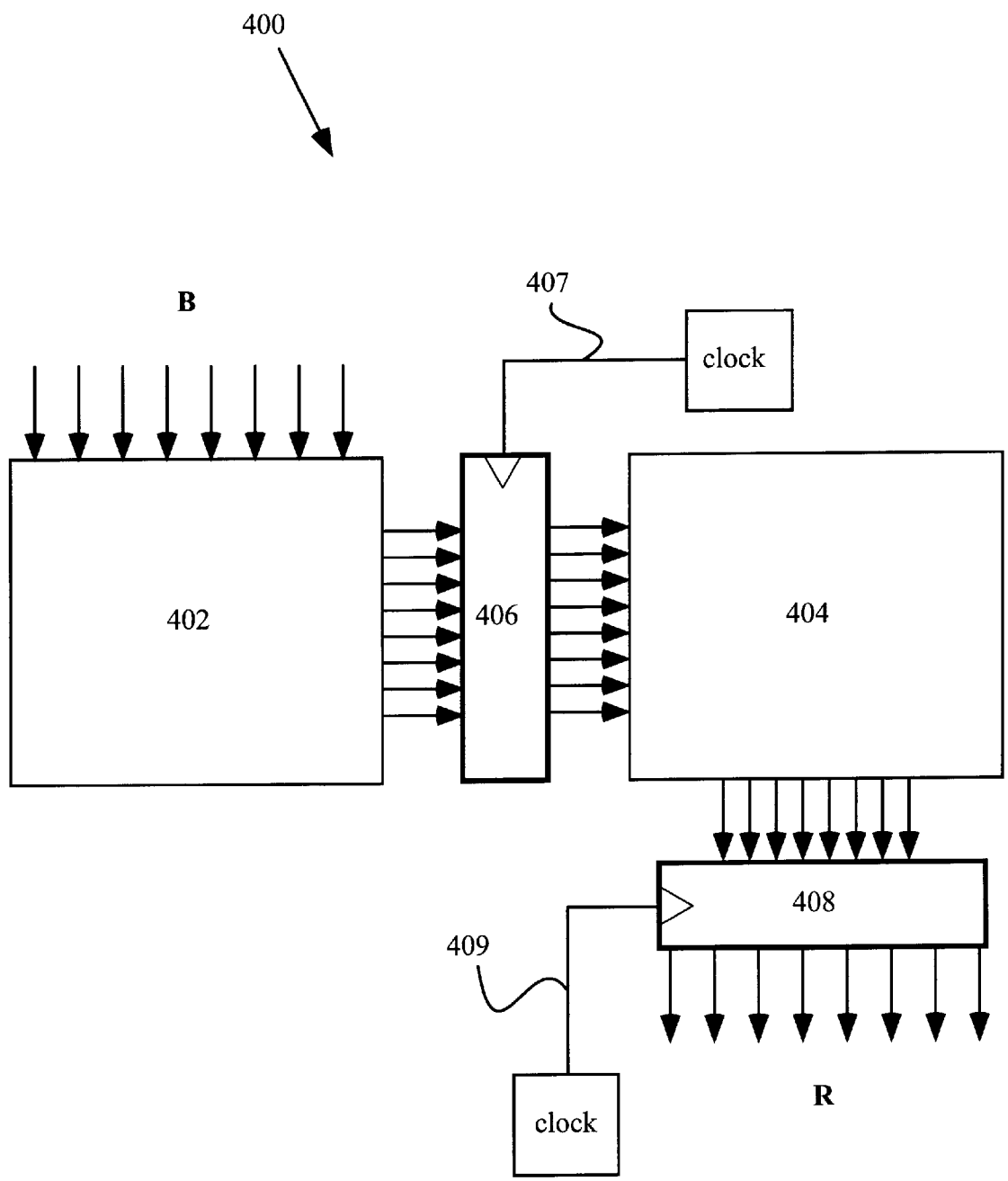
FIG. 8 is a schematic representation of a complex programmable logic device operable as a pipelined synchronous content addressable memory in accordance with another embodiment of the invention.

FIG. 8 is a schematic representation of a complex programmable logic device operable as a pipelined synchronous content addressable memory (CAM) 400 in accordance with another embodiment of the invention. The pipelined synchronous CAM 400 includes an address selector unit 402 coupled to a first data latch 406. A system clock can be coupled to a CLK input node of the synchronous data latch 406 by way of a clock connector 407. With data latch 406 in a synchronous mode, data latch 406 stores data, such as for example the address select signal S, in accordance with the system clock. The data latch 406 is also connected to a selector decoder unit 404 which, in turn, is connected to a second synchronous data latch 408. The system clock can be coupled to a CLK input node of the synchronous data latch 408 by way of a clock connector 409.

In operation, a request dataword B, for example, can be received by the address selector unit 402 which then supplies the address select signal S to the first data latch 406 in accordance with the system clock. The address select signal S is then passed to the selector decoder unit 404 also in accordance with the system clock. The selector decoder unit 404 then supplies an appropriate output signal to the second data latch 408 which outputs the received appropriate output signal also in accordance with the system clock.

Figure 9:
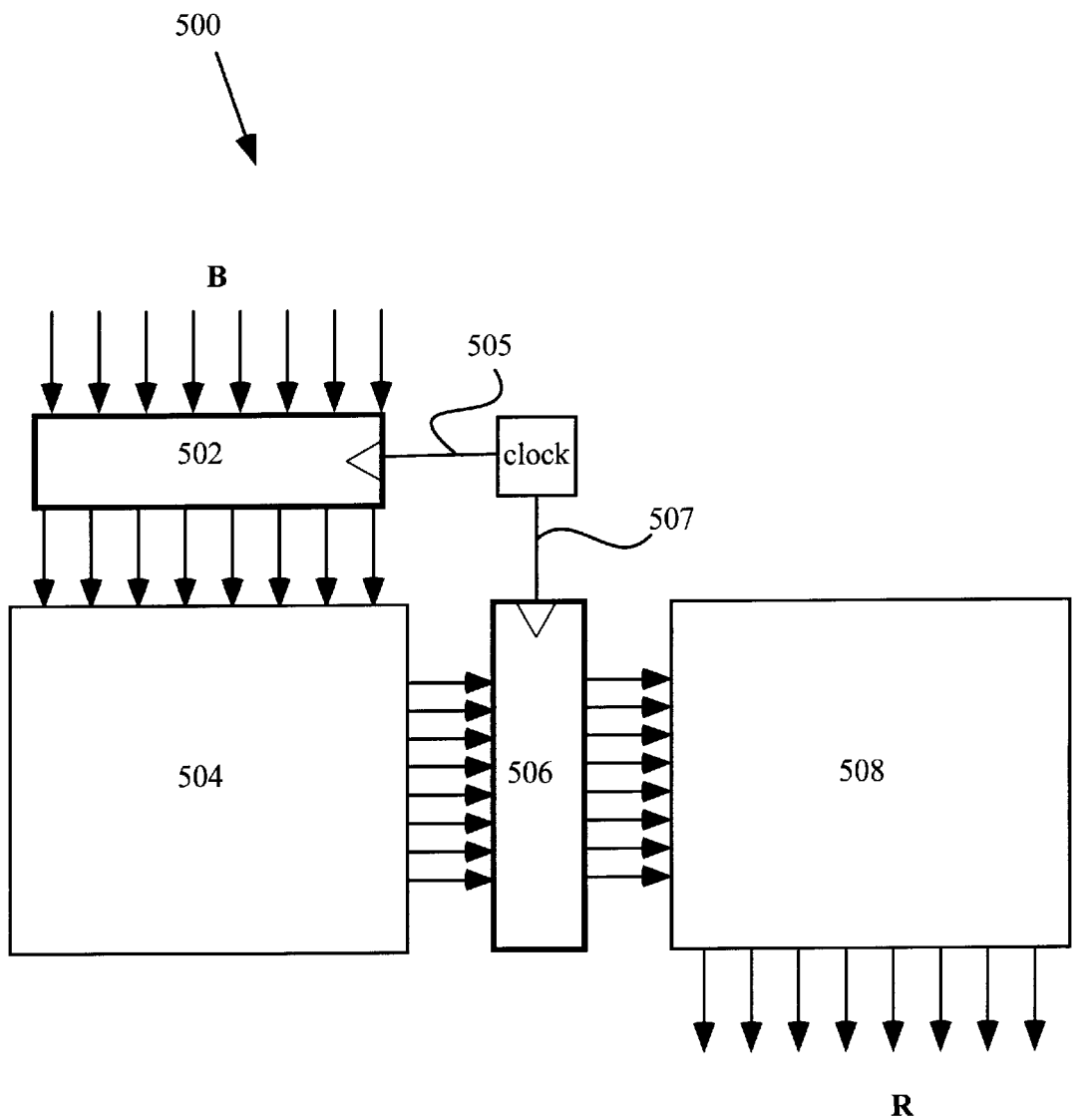
FIG. 9 is a schematic representation of a complex programmable logic device operable as a synchronous content addressable memory in accordance with yet another embodiment of the invention.

FIG. 9 is a schematic representation of a complex programmable logic device operable as a synchronous content addressable memory (CAM) 500 in accordance with yet another embodiment of the invention. The synchronous CAM 500 includes a first synchronous data latch 502 connected to an address selector unit 504. A system clock can be coupled to a CLK input node of the synchronous data latch 502 by way of a clock connector 505. With synchronous data latch 502 in a the synchronous mode, synchronous data latch 502 stores data, such as for example a request dataword B, in accordance with the system clock. The address selector unit 504 can, in turn, be connected to a second synchronous data latch 506. The system clock can be coupled to a CLK input node of the second synchronous data latch 506 by way of a clock connector 507. The second synchronous data latch 506 can, in turn, be connected to a selector decoder unit 508.

In operation, a request dataword B, for example, can be received by the data latch 502 and stored therein in accordance with the system clock. Again, in accordance with the system clock, the first data latch 504 can supply the stored request word dataword B to the address selector unit 504. The address selector unit 504 can then supply an address select signal S, for example, to the second data latch 506. In accordance with the system clock, the second data latch 506 can store the received address select signal S. The second data latch 506 can then send the stored select signal S to the address decoder unit 508 in accordance with the system clock. The address decoder unit 508 can then output an appropriate output signal.

There are several advantages to using implementing a content addressable memory according to the invention. In the case where the invention is implemented as a CPLD, the CPLD can successfully be applied to many additional uses that were previously infeasible or impractical. For example, several applications in the areas of high speed data retrieval and high speed communications are now economically feasible with the advent of the invention. The capability to configure a CPLD in real time as an efficient content addressable memory also greatly expands the number of potential uses for the CPLD while keeping costs low.

Although the foregoing invention has been described in some detail for purposes of clarity of understanding, it will be apparent that certain changes and modifications may be practiced within the scope of the appended claims. It should be noted that there are many alternative ways of implementing the present invention. It is therefore intended that the following appended claims be interpreted as including all such alterations, permutations, and equivalents as fall within the spirit and scope of the present invention.

What is claimed is:

1. A PLD, comprising:

a first multi-function functional block having a plurality of operation modes, a first of the operation modes enables said first multi-function functional block to receive a request dataword on input lines, to compare the request dataword with a plurality of keyword datawords previously stored in a first programmable memory storage array of said first multi-function functional block in the first operation mode, and to output on output lines a select signal when the comparing indicates that the request dataword matches an identified keyword dataword of the keyword datawords, said keyword datawords being associated with a group of associated datawords;

a second multi-function functional block having a plurality of operation modes, in a first of the operation modes enables said second multi-function functional block to receive the select signal on input lines from said first multi-function functional block, to then select an associated dataword from the group of associated datawords previously stored in a second programmable memory storage array of said second multi-function functional block in the first operation mode, and then to output the selected associated dataword on output lines, the selected associated dataword being associated with the identified keyword dataword; and a programmable interconnection device that allows said first and second multi-function functional blocks to be programmably interconnected such that the select signal is supplied to said second multi-function functional block from said first multi-function functional block, wherein said first and second programmable memory storage array each are comprised of an array of programmable interconnections that either provide a connection or no connection.

2. A PLD as recited in claim 1, wherein said first and second multi-function functional blocks operate together in their respective first operation mode to act as a content addressable memory device.

3. An integrated circuit operable as a content addressable memory device, comprising:

a plurality of interconnection lines;

a first functional block having a first functional block input line and a first functional block output line that programmably connected to said plurality of interconnection lines, said first functional block stores at least one keyword dataword associated with a group of associated datawords, said first functional block receives a request dataword at said first functional block input line and generates a MATCH address signal when said received request dataword matches said at least one keyword dataword stored in said first functional block and a NO-MATCH address signal when said received dataword does not match said any keyword datawords stored in said first functional block at said first functional block output lines based upon a comparing of said received request dataword and said stored keyword dataword; and a second functional block having a second functional block input line programmably connected to said first functional block output line by way of said plurality of interconnection lines and a second functional block output line, said second functional block can store said group of associated datawords, said second functional block receives said select signal at said second functional block input lines and outputs to said second functional block output lines an output signal based on said received select signal.

4. An integrated circuit operable as a content addressable memory device as recited in claim 5, wherein said output signal is, a MATCH signal when said received request dataword matches said keyword dataword, and a NO-MATCH signal when said received request dataword does not match said keyword dataword.

5. An integrated circuit operable as a content addressable memory device as recited in claim 4, wherein said MATCH signal includes a result dataword associated with said matched keyword dataword and a MATCH flag indicative of a match between said received request dataword and said keyword dataword.

6. An integrated circuit operable as a content addressable memory device as recited in claim 4, wherein said NOMATCH signal includes a NOMATCH flag indicative of there being no match between said received request word and said keyword dataword.

7. An integrated circuit operable as a content addressable memory device as recited in claim 4, wherein said first functional block includes, a first functional block input unit connected to said first functional block input line such that said first functional block input unit can receive said request dataword, a true data output line connected to said first functional block input unit, said true data output line can pass a true request dataword value received from said first functional block input unit, a complementary data output line connected to said first functional block input unit, said complementary data output line can pass a complementary request dataword value received from said first functional block input unit, a first wordline and a second wordline programmably connected to said true data output line and said complementary data output line such that when said received request dataword matches said at least one keyword stored in said first functional block, then said first wordline and said second wordline both carry a first logical value, and an output buffer unit connected to said first functional block output line and said first wordline and said second wordline, said output buffer unit generates said select signal.

8. An integrated circuit operable as a content addressable memory device as recited in claim 7, wherein said select signal is a MATCH address select signal when said output buffer substantially simultaneously receives both said first logical values, and said select signal is a NOMATCH address select signal when said output buffer does not substantially simultaneously receive both said first logical values.

9. An integrated circuit operable as a content addressable memory device as recited in claim 8, wherein said output buffer unit includes, a logical AND circuit including,
a first logical AND circuit input line connected to said first wordline,
a second logical AND circuit input line connected to said second wordline, and
a logical AND gate output line connected to said first functional block output line.

10. An integrated circuit operable as a content addressable memory device as recited in claim 9, wherein said second functional block includes, a second functional block input unit connected to said second functional block input line such that said second functional block input unit can receive said MATCH address signal and said NO-MATCH address signal a memory array which stores said result word included in said group of associated datawords, and an output buffer unit connected to said second functional block output line and said memory array.

11. An integrated circuit operable as a content addressable memory device as recited in claim 10, wherein said integrated circuit is a programmable logic device.

12. An integrated circuit operable as a content addressable memory device as recited in claim 11, wherein said first functional block and said second functional block is an embedded array block, said embedded array block being capable of performing desired logic and/or logic-memory functions.

13. An integrated circuit operable as a content addressable memory device as recited in claim 12, wherein said embedded array block further includes at least one memory cell.

14. An integrated circuit operable as a content addressable memory device as recited in claim 13, wherein said embedded array block is operable in a P-term mode.

15. A method of using an integrated circuit operable as a content addressable memory, said integrated circuit having a first functional block coupled to a second functional block, said first fuctional block and said second functional block can store datawords, said method comprising:

(a) receiving a first dataword at said first functional block, said first dataword includes a first plurality of data bits;

(b) determining whether said received first dataword matches any one or more of second datawords stored in said first functional block, said second datawords each include a second plurality of data bits wherein said determining includes, comparing each of said first plurality of data bits associated with said first dataword to an associated one of said second plurality of data bits associated with said second datawords, and determining that said first dataword and one of said second datawords match when each of said first plurality of data bits associated with said first dataword are identical to said associated one of said second plurality of data bits associated with the one of said second datawords;

(c) sending an appropriate select signal from said first functional block to said second functional block based upon the determining (b) whether said received first dataword matches any one or more of said second datawords stored in said first functional block; and (d) outputting an appropriate output signal from said second functional block, said appropriate output signal based upon said appropriate select signal received from said first functional block, wherein said appropriate select signal sent to said second function block by said sending (c) is a NO-MATCH address signal when it is determined that said first dataword does not match at least one of said second datawords.

16. A method as recited in claim 15, wherein said appropriate select signal is a MATCH address signal when it is determined that said first dataword does match at least on of said second dataword.

17. A method as recited in claim 16, wherein said MATCH address signal is used by said second functional block to locate a third dataword stored in said second functional block, said third dataword being associated with said matched second dataword.

18. A method as recited in claim 17 wherein said appropriate output signal includes said third dataword, at least said matched second data word, and a MATCH signal.

19. A method as recited in claim 15, wherein said NO MATCH address signal is used by said second functional generate an appropriate output signal.

20. A method as recited in claim 19 wherein said appropriate output signal includes a NO-MATCH signal, said NO-MATCH signal being indicative of said received first dataword not matching any second dataword stored in said first functional block.

21. A method as recited in claim 15, wherein said integrated circuit is a programmable logic device.

22. A method as recited in claim 21 wherein said first functional block and said second functional block are embedded array blocks.

23. A method as recited in claim 22, wherein each of said embedded array blocks are operable in a P-term mode.

24. A programmable logic device, comprising:

a multi-function logic device that is capable of operating in a plurality of logic modes in accordance with programming signals; and a multi-function memory device that is capable of operating in a plurality of memory modes in accordance with programming signals, one of the memory modes being a content addressable memory mode.

25. A programmable logic device as recited in claim 24, wherein said programmable logic device further comprises:

a plurality of programmable interconnection lines operatively connecting said multi-function logic device and said multi-function memory device.

26. A programmable logic device as recited in claim 24 wherein another of the memory modes being a P-TERM mode.

27. A programmable logic device as recited in claim 24, wherein another of the memory modes being a Random Access Memory (RAM) mode.

* * * * *